US011610856B2

(12) United States Patent
Sankman et al.

(10) Patent No.: US 11,610,856 B2
(45) Date of Patent: Mar. 21, 2023

(54) CONNECTIVITY BETWEEN INTEGRATED CIRCUIT DICE IN A MULTI-CHIP PACKAGE

(71) Applicant: Intel Corporation, Santa Clara, CA (US)

(72) Inventors: Robert Sankman, Phoenix, AZ (US); Dheeraj Subbareddy, Portland, OR (US); Md Altaf Hossain, Portland, OR (US); Ankireddy Nalamalpu, Portland, OR (US)

(73) Assignee: Intel Corporation, Santa Clara, CA (US)

(*) Notice: Subject to any disclaimer, the term of this patent is extended or adjusted under 35 U.S.C. 154(b) by 678 days.

(21) Appl. No.: 16/449,923

(22) Filed: Jun. 24, 2019

(65) Prior Publication Data

US 2020/0402937 A1 Dec. 24, 2020

(51) Int. Cl.
*H01L 23/00* (2006.01)
*H01L 23/48* (2006.01)
*H01L 23/498* (2006.01)
*H01L 23/538* (2006.01)

(52) U.S. Cl.
CPC ............ *H01L 24/09* (2013.01); *H01L 23/481* (2013.01); *H01L 23/49811* (2013.01); *H01L 23/49827* (2013.01); *H01L 23/49838* (2013.01); *H01L 23/5384* (2013.01); *H01L 23/5386* (2013.01)

(58) Field of Classification Search
CPC . H01L 24/09; H01L 23/481; H01L 23/49811; H01L 23/49827; H01L 23/49838; H01L 23/5384; H01L 23/5386
See application file for complete search history.

(56) References Cited

U.S. PATENT DOCUMENTS

| 2016/0172332 A1* | 6/2016 | Haba | H01L 27/108 |
| | | | 257/774 |
| 2019/0123018 A1* | 4/2019 | Hwang | H01L 23/5389 |
| 2020/0185328 A1* | 6/2020 | Tanaka | G06F 11/1068 |

FOREIGN PATENT DOCUMENTS

| EP | 3511980 A1 * | 7/2019 | ........... H01L 23/481 |
| WO | WO-2016046987 A1 * | 3/2016 | ............. G11C 5/025 |

\* cited by examiner

*Primary Examiner* — Matthew E Warren
(74) *Attorney, Agent, or Firm* — Essential Patents Group, LLP.

(57) ABSTRACT

An integrated circuit package may be formed comprising an interposer with a center die and a plurality of identical integrated circuit dice positioned around the center die and attached to the interposer, wherein the center die is the switch/router for the plurality of identical integrated circuit dice. The interposer comprises a substrate, a central pattern of bond pads formed in or on the substrate for attaching the center die, and substantially identical satellite patterns formed in or on the substrate for attaching identical integrated circuit dice. The central pattern of bond pads has repeating sets of a specific geometric pattern and wherein the identical satellite patterns of bond pads are positioned to form the same geometric pattern as the specific geometric pattern of the central pattern of bond pads. Thus, substantially identical conductive routes may be formed between the center die and each of the identical integrated circuit dice.

25 Claims, 12 Drawing Sheets

CONNECTIVITY BETWEEN INTEGRATED CIRCUIT DICE IN A MULTI-CHIP PACKAGE

TECHNICAL FIELD

Embodiments of the present description generally relate to the field of integrated circuit package fabrication, and, more specifically, to an interposer within an integrated circuit package, wherein the interposer includes bond pad patterns that allow for electrically connecting a plurality of identical integrated circuit dice.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multiple integrated circuit devices, such as microelectronic dice, have been developed. These multiple integrated circuit device packages are referred to in the art as multi-device or multi-chip packages (MCPs) and offer the potential for increased architectural flexibility at reduced cost, but must do so such that appropriate integrated circuit device-to-integrated circuit device interconnects are provided. In order to cost-effectively achieve faster and smaller MCPs, multiple identical integrated circuit dice, such as central processing units (CPUs), graphics processing units (GPUs), field programmed gate arrays (FPGAs), and the like, may be incorporated with the MCPs. Currently, these identical integrated circuit dice, generally rectangular, are interconnected along the edges thereof. This limits the number of identical integrated circuit dice that can be connected in a radix fashion. As will be understood to those skilled in the art, if more than four integrated circuit dice are connected, they cannot be identical, because in order to achieve a latency optimized configuration (wide wire width and low speed), the integrated circuit dice must be unique to accommodate the unique bump or interconnection patterned needed to match the interconnection R/C (resistance/capacitance) delay. Of course, unique integrated circuit dice are prohibitively expensive with regard to die design, validation, fabrication mask costs, and manufacturing costs. Moreover, alternative solutions, such as rectangular approximations of radix configurations will result in needlessly larger integrated circuit package sizes.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
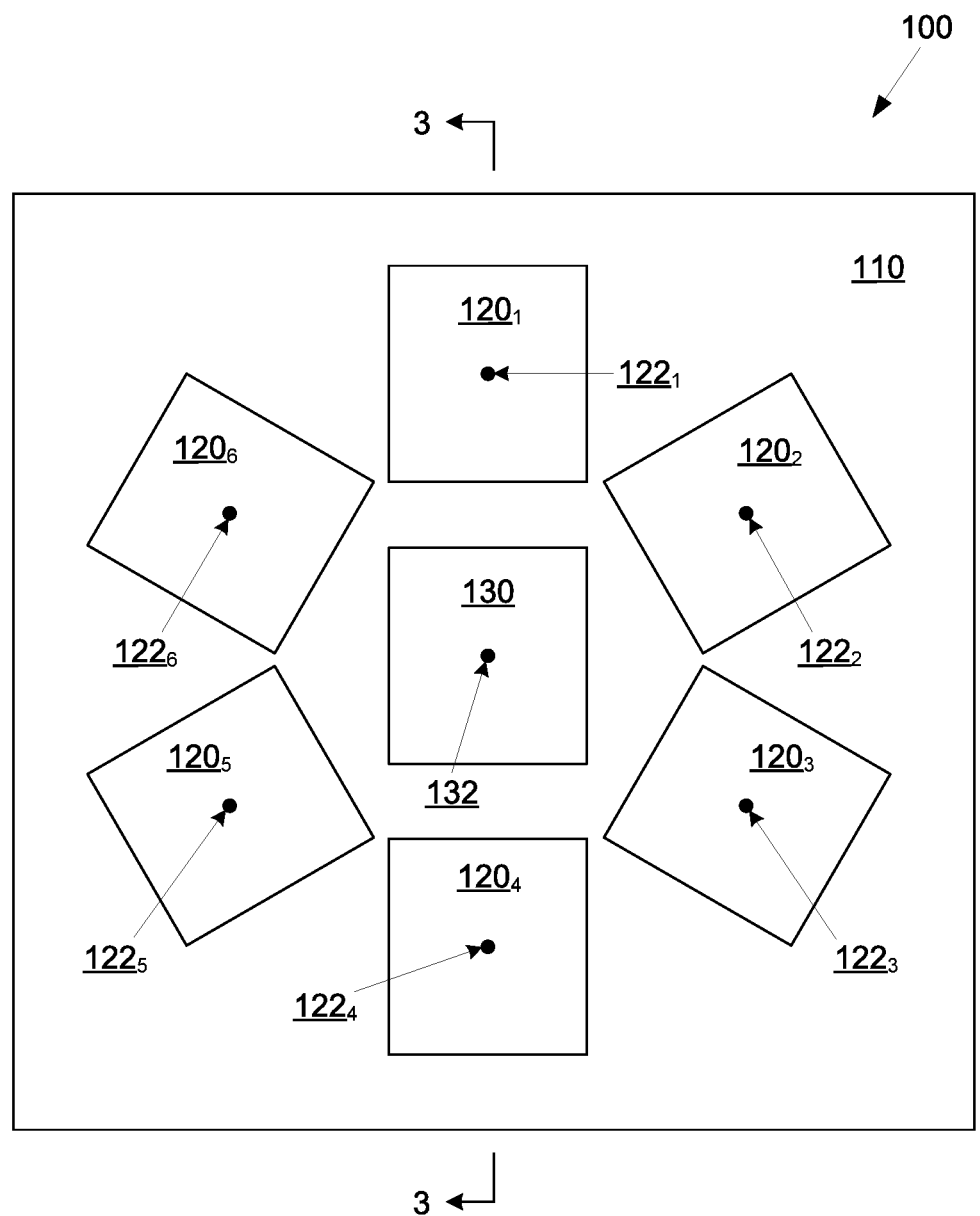
FIG. 1 is a top plan view of an integrated circuit package, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit package comprising an electronic interposer with a center die and a plurality of identical integrated circuit dice positioned around the center die and attached to the electronic interposer, wherein the center die is the switch/router for the plurality of identical integrated circuit dice. The electronic interposer may comprise a substrate, a central pattern of bond pads formed in or on the substrate for attaching the center die, and substantially identical satellite patterns of bond pads formed in or on the substrate for attaching identical integrated circuit dice. The central pattern of bond pads has repeating sets of a specific geometric pattern and wherein the identical satellite patterns of bond pads are positioned to form the same geometric pattern as the specific geometric pattern of the central pattern of bond pads. Thus, substantially identical conductive routes may be formed between the center die and each of the identical integrated circuit dice.

Figure 2:
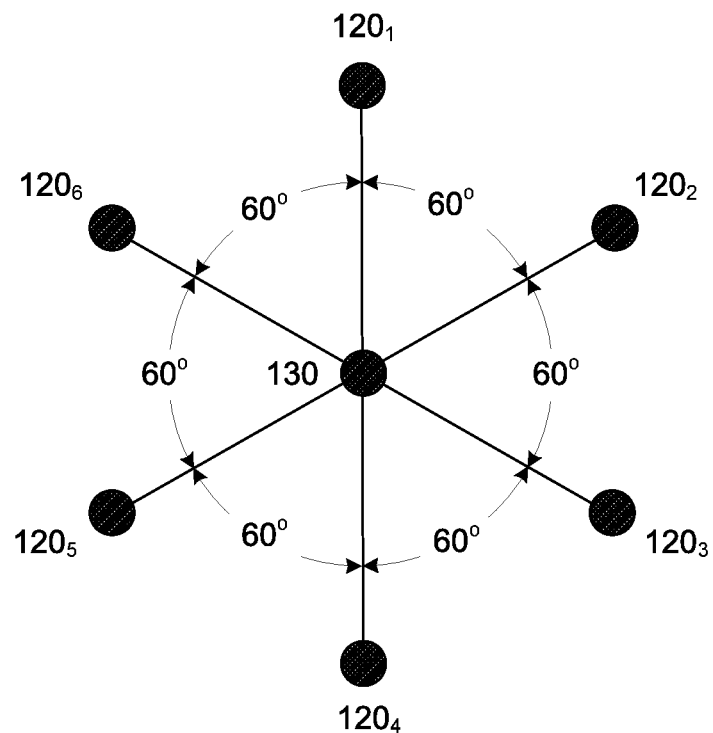
FIG. 2 is a schematic of the integrated circuit package of FIG. 1, according to an embodiment of the present description.

FIGS. 1 and 2 illustrate a top plan view and a schematic, respectively, of an arrangement of a plurality of identical integrated circuit dice, i.e. "satellite dice", (illustrated as elements 1201-1206) relative to a center die 130, wherein the integrated circuit die 1201-1206 and center die 130 are electrically attached to an electronic interposer 110, according to one embodiment of the present description. In the illustrated embodiment, six identical integrated circuit dice (i.e. a first integrated circuit die 1201, a second integrated circuit die 1202, a third integrated circuit die 1203, a fourth integrated circuit die 1204, a fifth integrated circuit die 1205, and a sixth integrated circuit die 1206) are arranged in a hexagonal pattern about the center die 130, such that they are positioned at 60 degree angles (see FIG. 2) between center points 1221-1226 of adjacent integrated circuit dice 1201-1206 relative to a center point 132 of the center die 130 (see FIG. 1).

Figure 3:
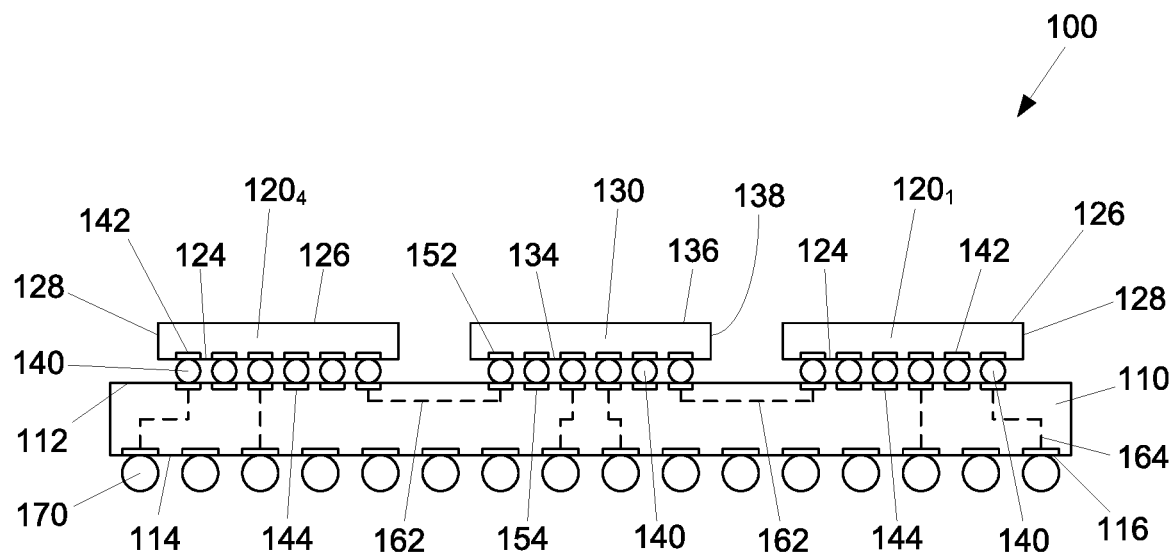
FIG. 3 is a side cross-sectional view along line 3-3 of FIG. 1, according to one embodiment of the present description.

As shown in FIG. 3, the integrated circuit dice 1201-1206 (only integrated circuit dice 1201 and 1204 shown) and the center die 130 of FIG. 1 may be attached to a first surface 112 of the electronic interposer 110 with a plurality of interconnects 140. The plurality of interconnects 140 may extend between bond pads 142 formed in or on a first surface 124 (also known as the "active surface") of the integrated circuit dice 1201-1206, and substantially mirror-image bond pads 144 formed in or on the first surface 112 of the electronic interposer 110, as well as between bond pads 152 formed in or on a first surface 134 of the center die 130, and substantially mirror-image bond pads 154 formed in or on the first surface 112 of the electronic interposer 110. The integrated circuit dice 1201, 1204 may further include a second surface 126 (also known as the "back surface") opposing the first surface 124 and at least one side 128 extending between the first surface 124 and the second surface 126 of the integrated circuit dice 1201, 1204. The identical integrated circuit dice 1201-1206 may be any appropriate devices, including, but not limited to, central processing units (CPUs), graphics processing units (GPUs), and field programmable gate arrays (FPGAs). The center die 130 may also include a second surface 136 opposing the first surface 134 and at least one side 138 extending between the first surface 134 and the second surface 136 of the center die 130. The interconnects 140 may be any appropriate electrically conductive material or structure, including but not limited to, solder balls, metal bumps or pillars, metal filled epoxies, or a combination thereof. In one embodiment, the interconnects 140 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the interconnects 140 may be copper bumps or pillars. In a further embodiment, the interconnects 140 may be metal bumps or pillars coated with a solder material.

As further shown in FIG. 3, the electronic interposer 110 may comprise a substrate 116 having device-to-device conductive routes 162 (illustrated as dashed lines) therein providing electrically communication between the integrated circuit dice 1201-1206 and the center die 130. The electronic interposer 110 may also comprise conductive routes 164 (illustrated as dashed lines) between the bond pads 142 to interposer-to-substrate bond pads 118 on a second surface 114 of the electronic interposer 110. External interconnects 170 may be attached to the interposer-to-substrate bond pads 118 for the attachment to external components (not shown), such as a motherboard. The conductive routes 162 and 164 may be referred to herein as "metallization". As will be understood to those skilled in the art, the bond pads 142 of each of the integrated circuit dice 1201-1206 may be in electrical communication with integrated circuitry (not shown) within the respective integrated circuit dice 1201-1206, and the bond pads 152 of each of the center die 130 may be in electrical communication with integrated circuitry (not shown) within the center die 130.

The substrate 116 of the electronic interposer 110 may comprise a plurality of dielectric material layers (not shown in FIG. 3), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive routes 162 and 164 may be a combination of conductive traces (not shown) and conductive vias (not shown) that extend through the plurality of dielectric material layers (not shown). These conductive traces and conductive vias, and processes of forming the same, are well known in the art and are not shown in FIG. 3 for purposes of clarity. The conductive traces and the conductive vias may be made of any appropriate conductive material, including but not limited to, metals, such as copper, silver, nickel, gold, and aluminum, alloys thereof, and the like. As will be understood by those skilled in the art, the electronic interposer 110 may be a cored substrate or a coreless interposer.

Figure 4:
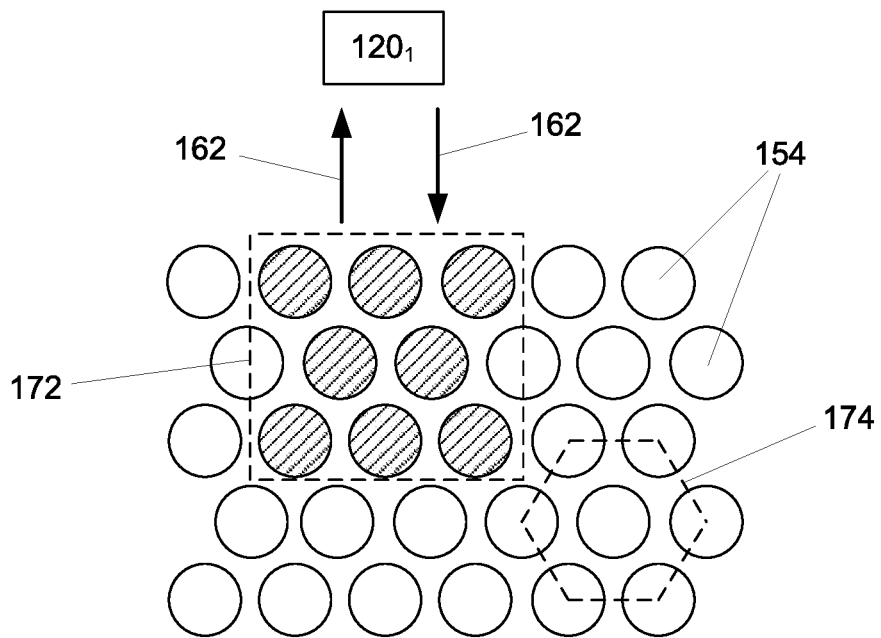
FIGS. 4-9 are schematic representations of a bond pad pattern for a center die, according to an embodiment of the present description.
Figure 5:
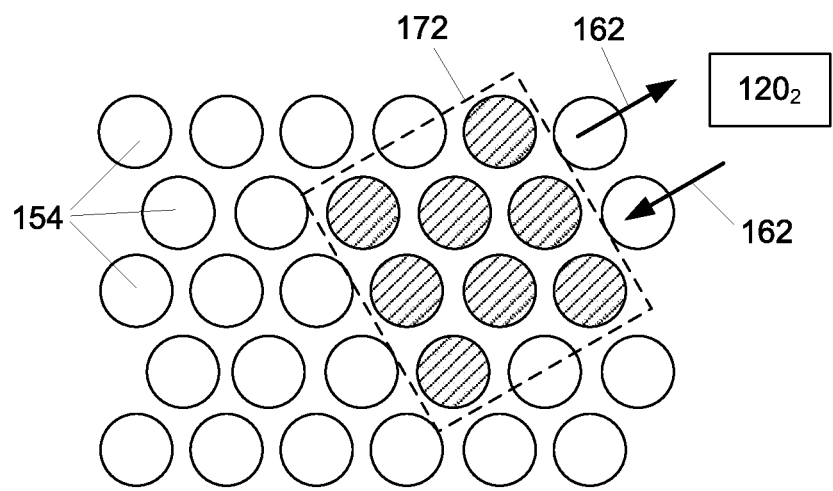
Figure 6:
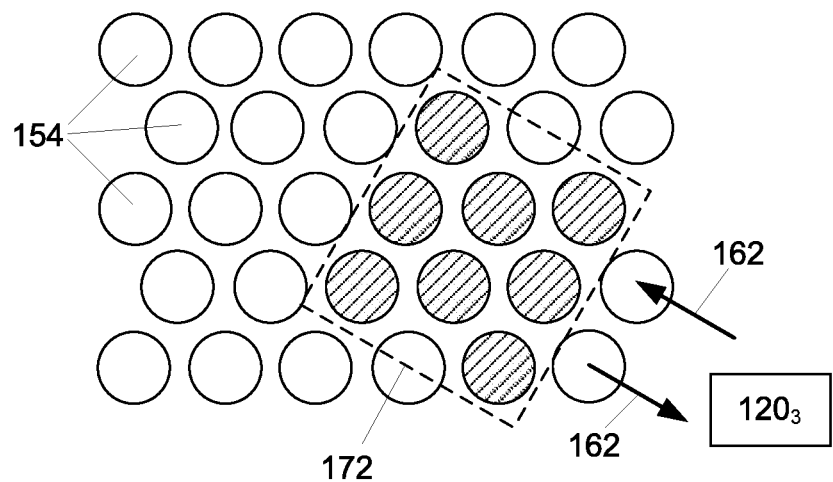
Figure 7:
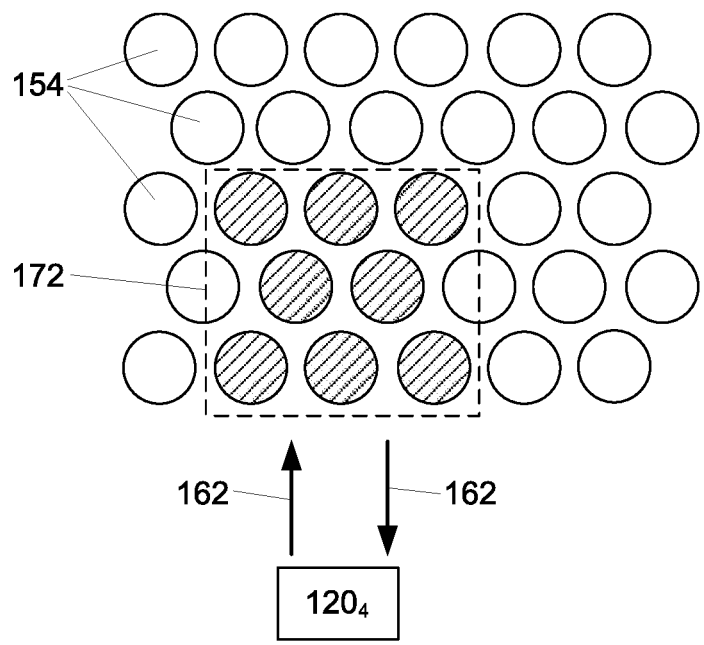
Figure 8:
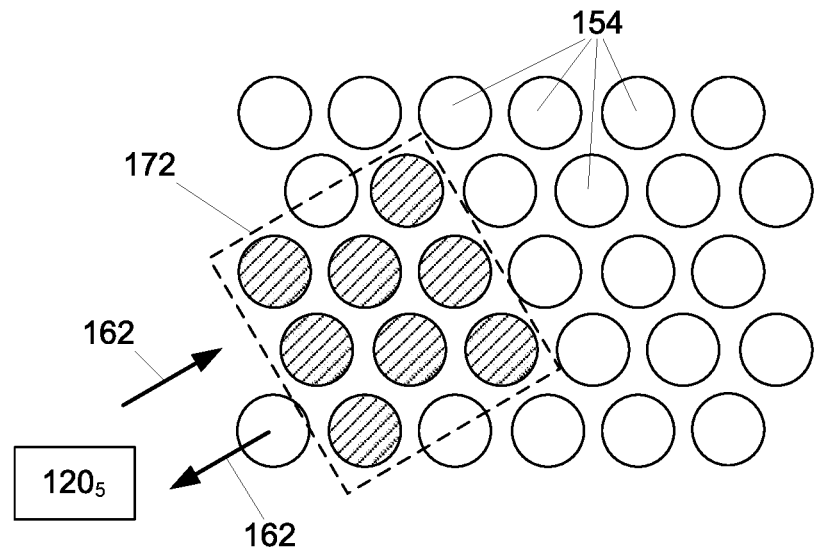
Figure 9:
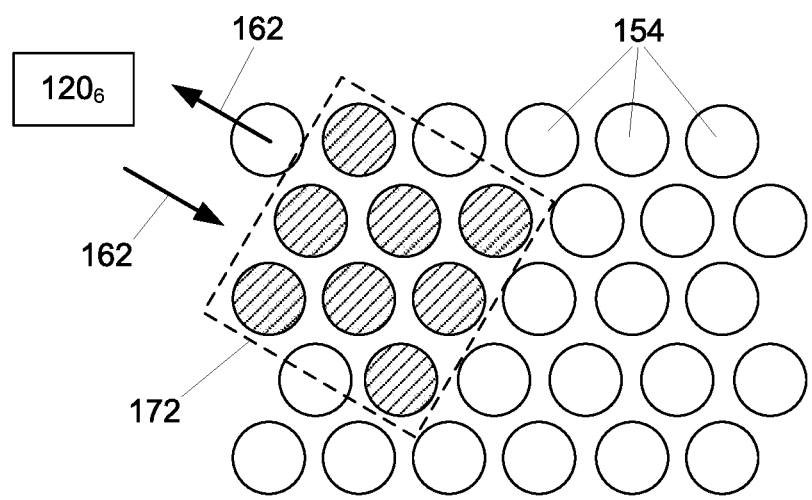

As shown in FIG. 4, the central pattern of bond pads 154 has repeating sets of a specific geometric pattern 174 (i.e. a hexagonal pattern in this embodiment) and wherein the plurality of separate, substantially identical satellite patterns of bond pads are positioned to form the same geometric pattern as the specific geometric pattern of the central pattern of bond pads, as will be shown. When bond pads 154 are selected in a set 172 (3-2-3 pattern) to interface with the first integrated die 1201, as shown in FIG. 4, the same pattern of the set 172 will also be able to interface with the second integrate die 1202, but rotated 60 degrees as shown in FIG. 5. This continues for all of the integrated circuit dice rotating 60 degrees clockwise with each integrated circuit die, e.g. third integrated circuit die 1203 in FIG. 6, fourth integrated circuit die 1204 in FIG. 7, fifth integrated circuit die 1205 in FIG. 8, and sixth integrated circuit die 1206 in FIG. 9.

Figure 10:
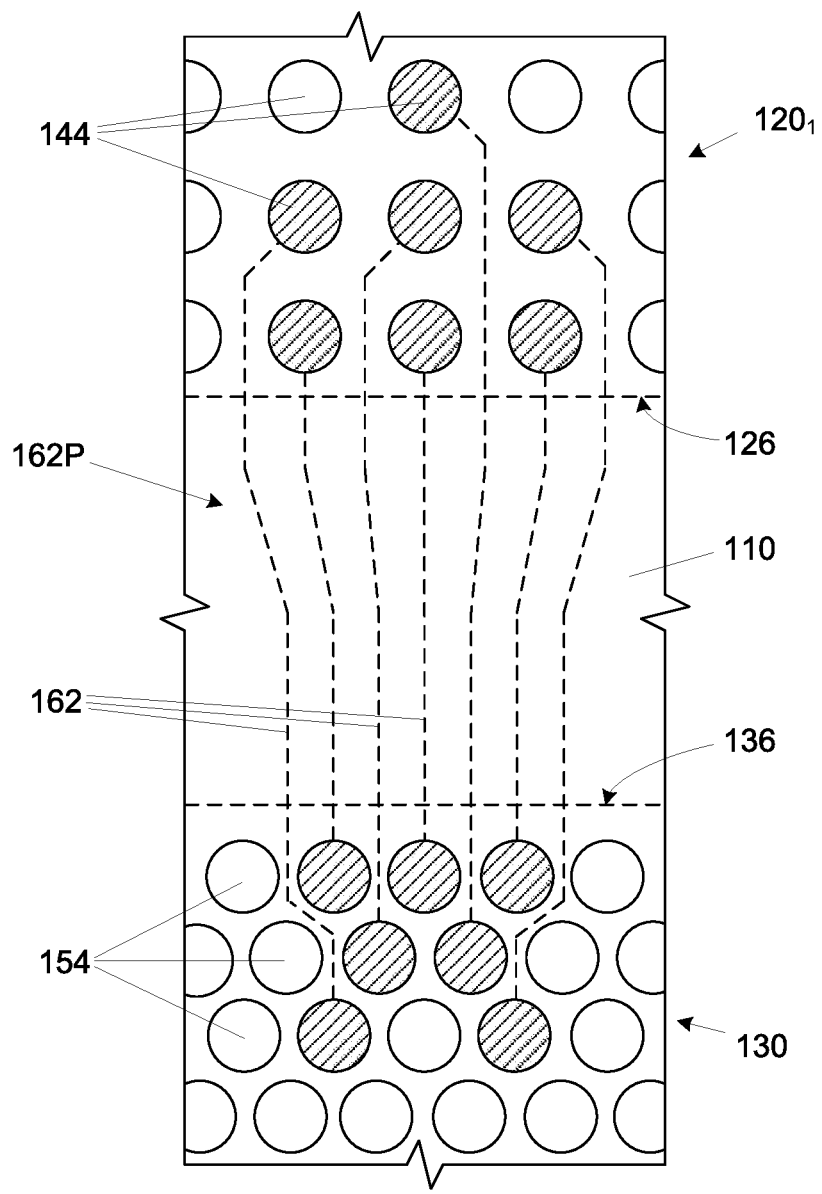
FIG. 10 is a top plan view of a portion of an interposer of an integrated circuit package, according to one embodiment of the present description.
Figure 11:
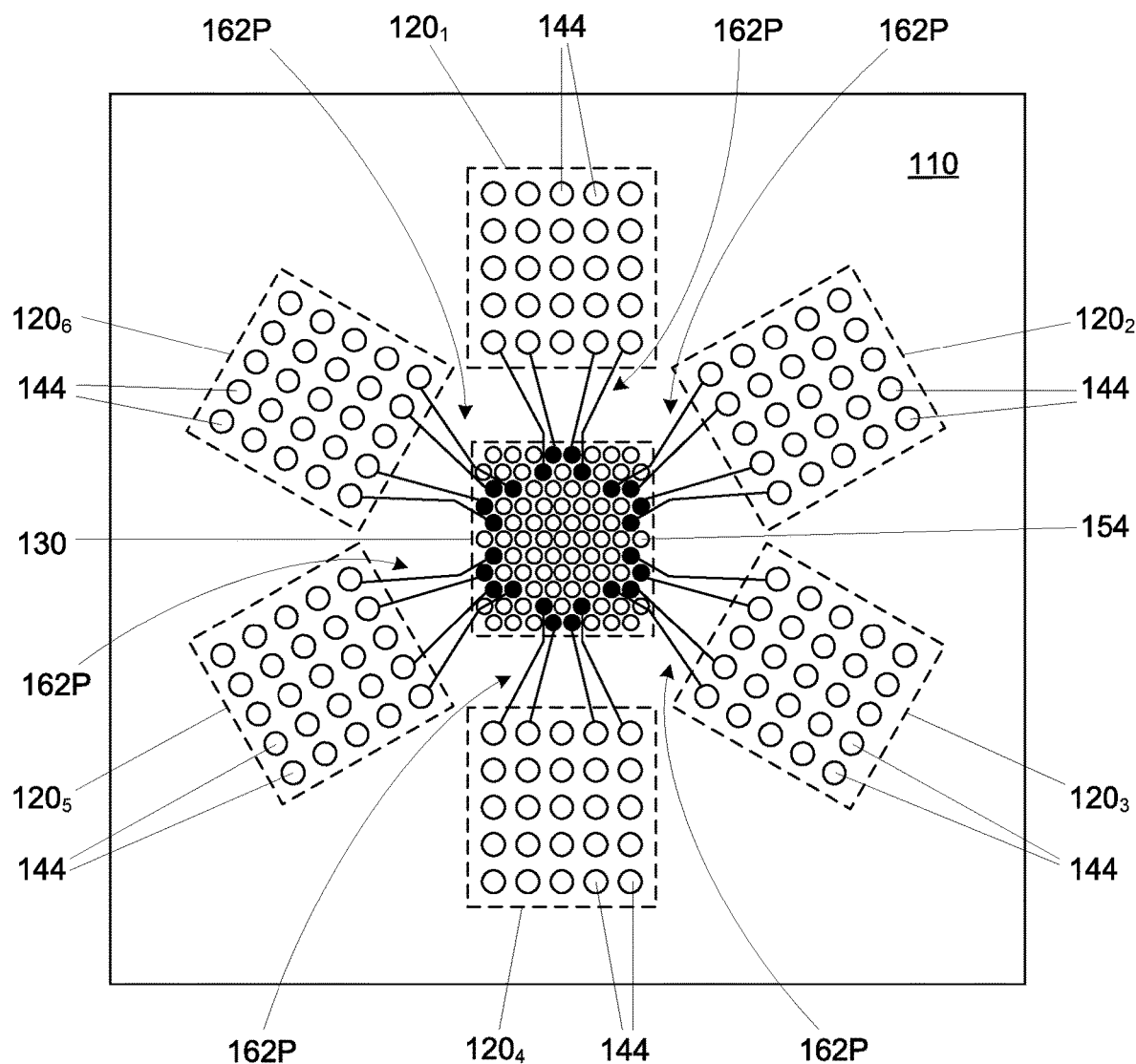
FIG. 11 is a top plan view of an interposer of an integrated circuit package, according to one embodiment of the present description.

As shown in FIG. 10, a pattern 162P is formed from the conductive routes 162 between at least a portion the central pattern of bond pads 154 of the electronic interposer 110 and at least a portion of the satellite pattern of bond pads 144 for each integrated circuit die (shown as first integrated circuit 1201). As shown in FIG. 11, substantially identical conductive route patterns 162P are repeated between substantially identical satellite patterns of bond pads 144 for each integrated circuit die 1201-1206 and the central pattern of bond pads 154 for the center die 130.

As will be understood to those skilled in the art, the embodiment of the present description will require only two unique tape-outs, i.e. one for the central pattern of bond pads 154 and one for the conductive routes 162 and satellite pattern of bond pads 144, wherein the tape-out is rotated. As all of the conductive route patterns 162P are identical in physical and electrical characteristics, all of the integrated circuit dice 1201-1206 can be identical. The embodiments of the present description will allow any one integrated circuit die 1201-1206 to reach any other integrated circuit die 1201-1206 in precisely two hops.

In additional embodiments, the center die 130 may include an optical lead-out (not shown) from the integrated circuit package 100. In order to mitigate any thermal impact, the optical connection out from the optical lead-out (not shown) can be from the bottom or second surface 114 side of the interposer 110. In a further embodiment, each of the integrated circuit dice 1201-1206 may be connected to memory device or memory circuitry (not shown). In still a further embodiment, the integrated circuit package 100 may be network-on-chip enabled with the integrated circuit dice 1201-1206 being field programmable gate arrays and the center die 130 being a network-on-chip switch, which is similar to an ultra-path interconnect switch used in an multiple-socket system node controller, as will be understood to those skilled in the art.

Figure 12:
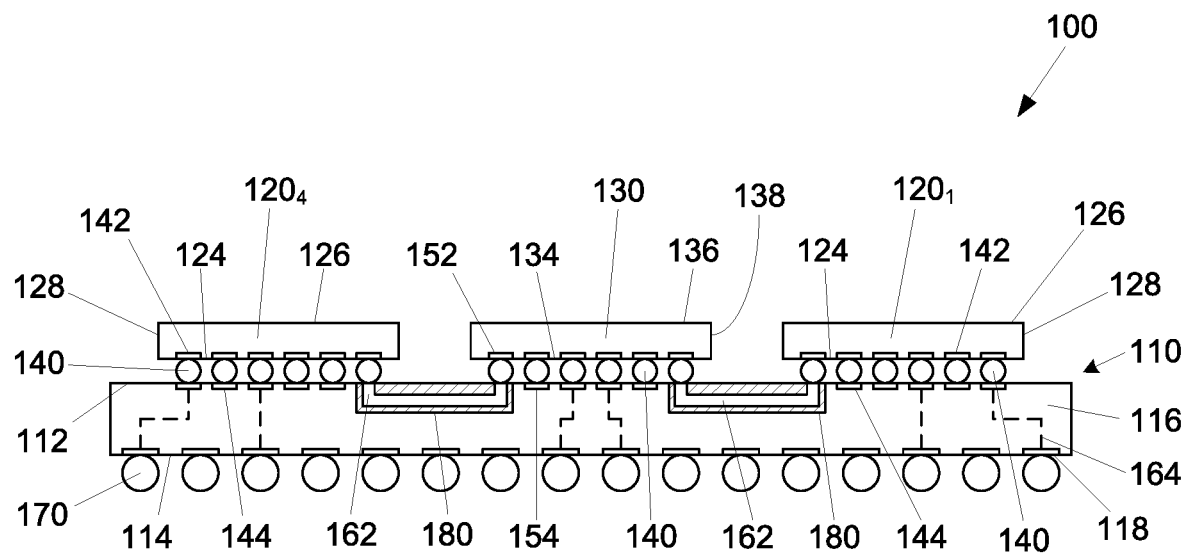
FIGS. 12 and 13 are side cross-sectional views of integrated circuit packages, according to embodiments of the present description.
Figure 13:
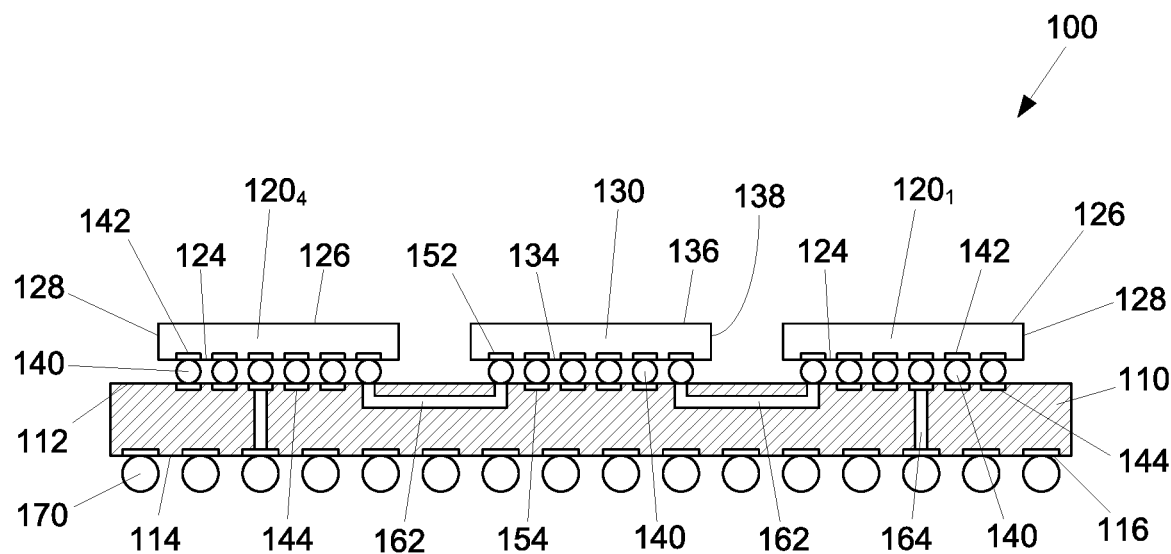
Figure 14:
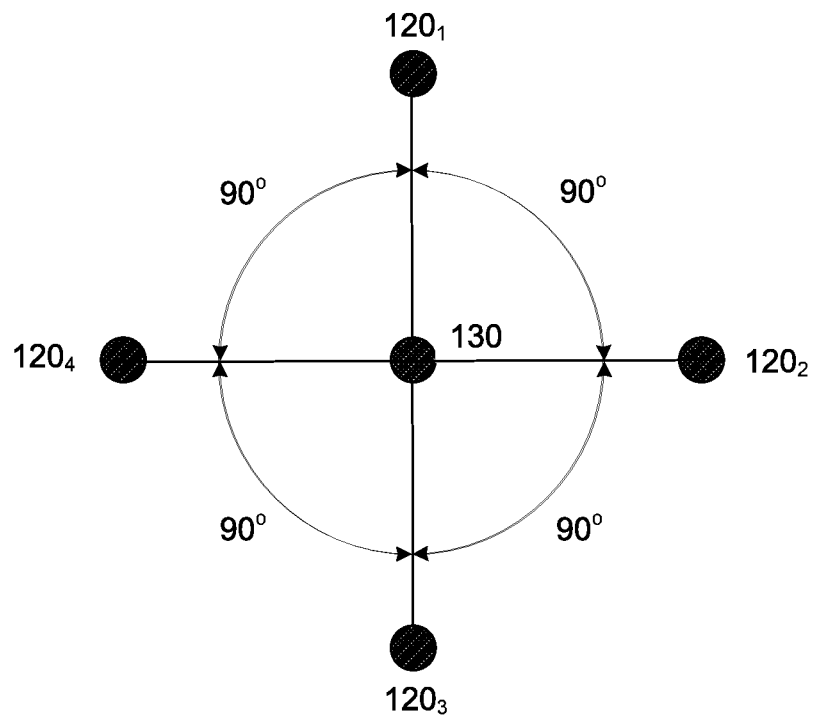
FIGS. 14-16 are schematics of integrated circuit packages, according to embodiments of the present description.

As illustrated in FIG. 11, at least one silicon bridge 180 may be embedded in the substrate 116 of the electronic interposer 110. The silicon bridge 180 may include the at least one device-to-device conductive route 162. As will be understood to those skilled in the art, silicon bridges may be preferred because silicon processing technology is relatively advanced, and interconnect pitches and line widths for the device-to-device conductive route 162 that are achievable using existing silicon process technology may be significantly smaller, and thus more dense, than what is possible using, for example, currently available technology for copper signal lines in polymer layers, as is common in interposer fabrication. As illustrated in FIG. 12, the entire substrate 116 may be formed of silicon. The embodiments of the present description may be particularly conducive to the use of the silicon substrate 116, as the bump patterns tend to be very regular (i.e., no pitch or pattern changes). In such an embodiment, the conductive routes 164 would be fabricated as through-silicon vias, as will be understood to those skilled in the art.

Figure 15:
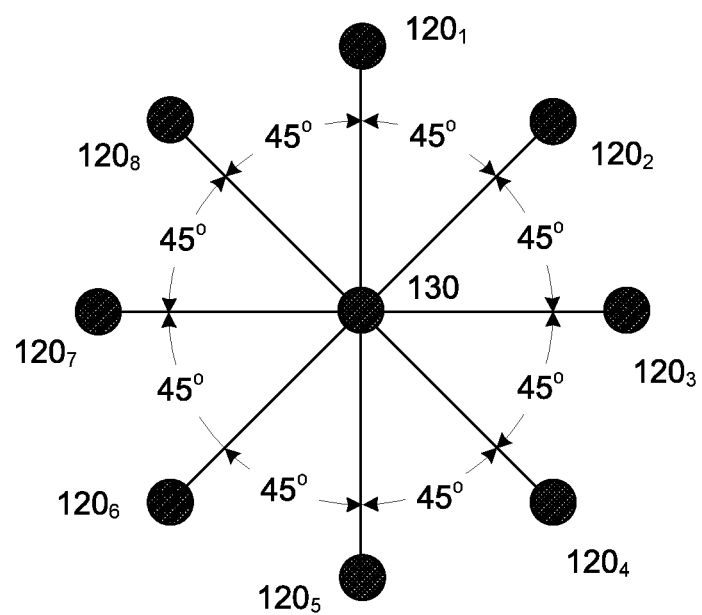
Figure 16:
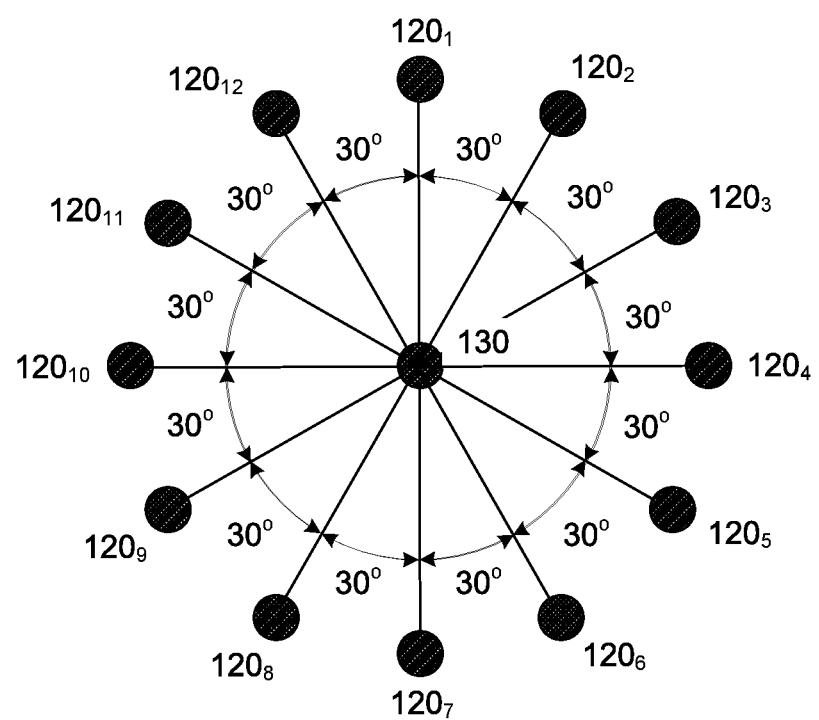

Although the embodiment illustrated in FIGS. 1-13 are directed to a hexagonal arrangement of the integrated circuit dice and the bond pads for the attachment of the center die, the present description is not so limited. In an additional embodiment, there may be four identical integrated circuit dice (i.e. first integrated circuit die 1201, second integrated circuit die 1202, third integrated circuit die 1203, and fourth integrated circuit die 1204) arranged about the center die 130, such that they are positioned orthogonal (i.e. at about 90 degree angles) between adjacent integrated circuit dice 1201-1208. In a further embodiment, as shown in FIG. 15, there may be eight identical integrated circuit dice (i.e. first integrated circuit die 1201, second integrated circuit die 1202, third integrated circuit die 1203, fourth integrated circuit die 1204, fifth integrated circuit die 1205, sixth integrated circuit die 1206, seventh integrated circuit die 1207, and integrated circuit die 1208) arranged in an octagonal pattern about the center die 130, such that they are positioned at 45 degree angles between adjacent integrated circuit dice 1201-1208. The bond pads 154 (see FIG. 3) for the center die 130 would be arranged in repeating octagons. In still a further embodiment, as shown in FIG. 16, there may be twelve identical integrated circuit dice (i.e. first integrated circuit die 1201, second integrated circuit die 1202, third integrated circuit die 1203, fourth integrated circuit die 1204, fifth integrated circuit die 1205, sixth integrated circuit die 1206, seventh integrated circuit die 1207, eighth integrated circuit die 1208, ninth integrated circuit die 1209, tenth integrated circuit die 12010, eleventh integrated circuit die 12011, and twelfth integrated circuit die 12012) arranged in an dodecagonal pattern about the center die 130, such that they are positioned at 30 degree angles between adjacent integrated circuit dice 1201-12012. The bond pads 154 (see FIG. 3) for the center die 130 would be arranged in repeating dodecagons.

Figure 17:
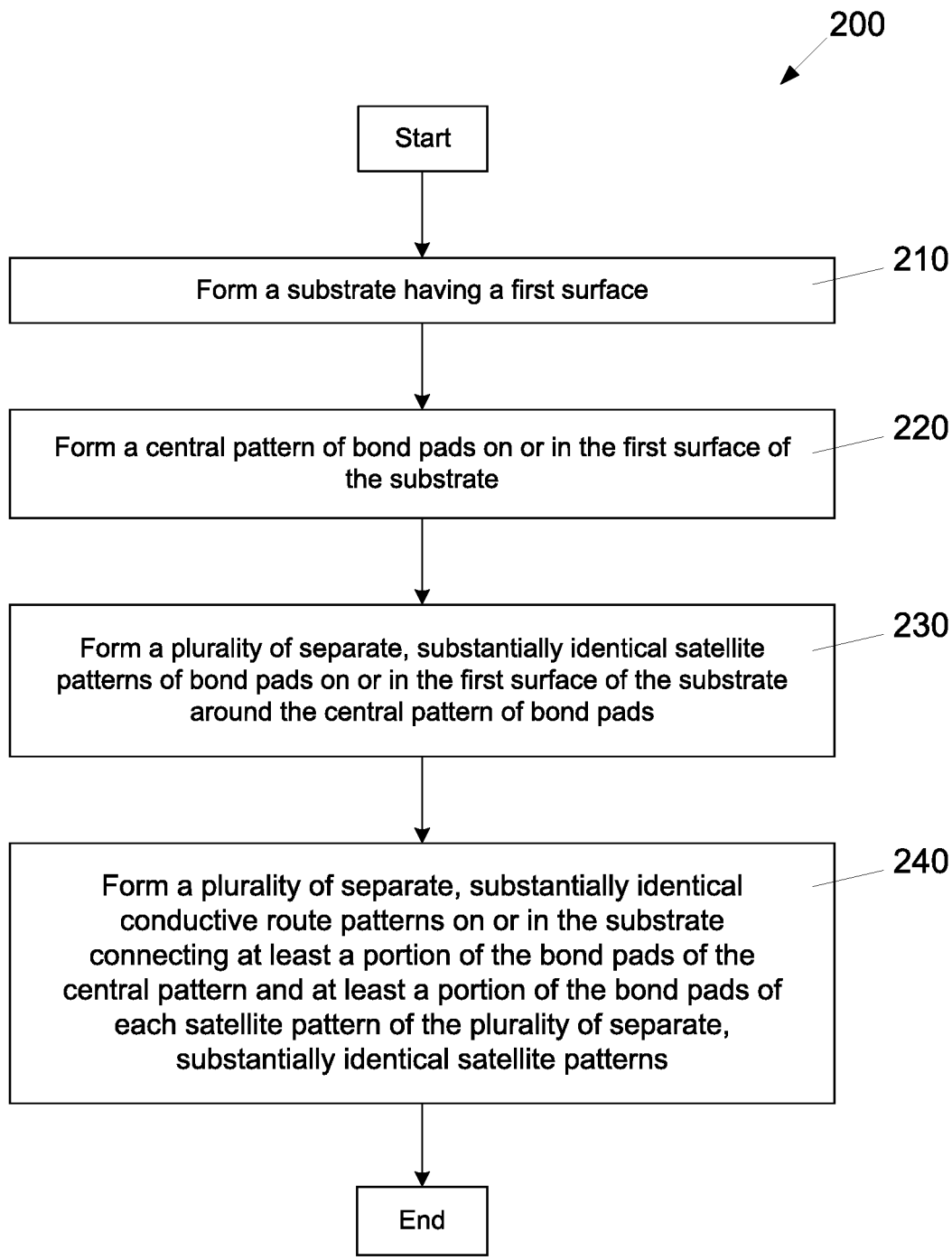
FIG. 17 is a flow chart of a process of fabricating an interposer for an integrated circuit package, according to an embodiment of the present description.

FIG. 17 is a flow chart of a process 200 of fabricating an interposer according to an embodiment of the present description. As set forth in block 210, a substrate having a first surface may be formed. A central pattern of bond pads may be formed on or in the first surface of the substrate, as set forth in block 220. As set forth in block 230, a plurality of separate, substantially identical satellite patterns of bond pads on or in the first surface of the substrate around the central pattern of bond pads. The plurality of separate, substantially identical conductive route patterns on or in the substrate connecting at a portion of the bond pads of the central pattern and at least a portion of the bond pads of each satellite pattern of the plurality of separate, substantially identical satellite patterns, as set forth in block 240.

Figure 18:
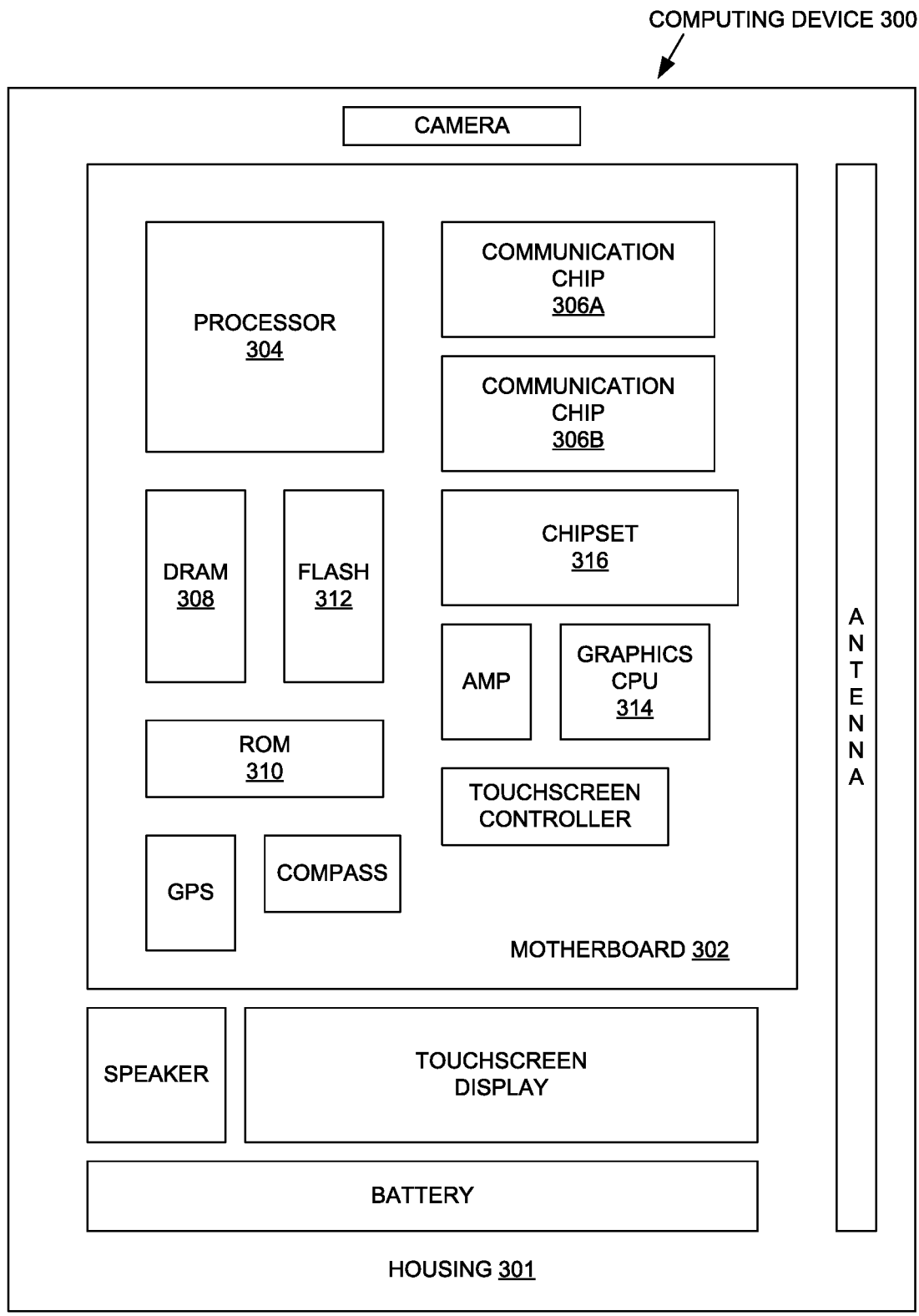
FIG. 18 is an electronic system, according to one embodiment of the present description.

FIG. 18 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package comprising an interposer, including a substrate having a first surface; a central pattern of bond pads on or in the first surface of the substrate; A plurality of separate, substantially identical satellite patterns of bond pads on or in the first surface of the substrate around the central pattern of bond pads; and a plurality of separate, identical conductive route patterns on or in the substrate connecting at least a portion of the bond pads of the central pattern and at least a portion of the bond pads of each of the plurality of separate, substantially identical satellite patterns; a central die electrically attached to the central pattern of bond pads; and a plurality of substantially identical integrated circuit dice, wherein each integrated circuit die of the plurality of substantially identical integrated circuit dice is electrically connected to a corresponding satellite pattern of the plurality of separate, substantially identical satellite patterns.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-18. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an electronic interposer, comprising a substrate having a first surface, a central pattern of bond pads on or in the first surface of the substrate, a plurality of separate, substantially identical satellite patterns of bond pads on or in the first surface of the substrate around the central pattern of bond pads, and a plurality of separate, identical conductive route patterns on or in the substrate connecting at least a portion of the bond pads of the central pattern and at least a portion of the bond pads of each satellite pattern of the plurality of separate, substantially identical satellite patterns.

In Example 2, the subject matter of Example 1 can optionally include the central pattern of bond pads having repeating sets of a specific geometric pattern and wherein the plurality of separate, substantially identical satellite patterns of bond pads are positioned to form the same geometric pattern as the specific geometric pattern of the central pattern of bond pads.

In Example 3, the subject matter of Example 2 can optionally include the plurality of separate, substantially identical satellite patterns of bond pads comprises four separate, substantially identical satellite patterns of bond pads that are positioned orthogonally between adjacent satellite patterns of bond pads.

In Example 4, the subject matter of Example 2 can optionally include the plurality of separate, substantially identical satellite patterns of bond pads comprises six separate, substantially identical satellite patterns of bond pads that are positioned to form a hexagonal geometric pattern.

In Example 5, the subject matter of Example 2 can optionally include the plurality of separate, substantially identical satellite patterns of bond pads comprises eight separate, substantially identical satellite patterns of bond pads that are positioned to form an octagonal geometric pattern.

In Example 6, the subject matter of any of Examples 1 to 5 can optionally include the substrate includes plurality of silicon bridges within the substrate wherein each of the conductive route pattern of the plurality of separate, identical conductive route patterns are formed in a corresponding one of the plurality silicon bridges.

In Example 7, the subject matter of any of Examples 1 to 5 can optionally include the substrate comprising silicon.

Example 8 is an integrated circuit package comprising an electronic interposer, comprising a substrate having a first surface, a central pattern of bond pads on or in the first surface of the substrate, a plurality of separate, substantially identical satellite patterns of bond pads on or in the first surface of the substrate around the central pattern of bond pads, and a plurality of separate, identical conductive route patterns on or in the substrate connecting at least a portion of the bond pads of the central pattern and at least a portion of the bond pads of each satellite pattern of the plurality of separate, substantially identical satellite patterns; a central die electrically attached to the central pattern of bond pads; and a plurality of substantially identical integrated circuit dice, wherein each integrated circuit die of the plurality of substantially identical integrated circuit dice is electrically connected to a corresponding satellite pattern of the plurality of separate, substantially identical satellite pattern.

In Example 9, the subject matter of Example 8 can optionally include the central pattern of bond pads having repeating sets of a specific geometric pattern and wherein the plurality of separate, substantially identical satellite patterns of bond pads are positioned to form the same geometric pattern as the specific geometric pattern of the central pattern of bond pads.

In Example 10, the subject matter of Example 9 can optionally include the plurality of separate, substantially identical satellite patterns of bond pads comprises four separate, substantially identical satellite patterns of bond pads that are positioned orthogonally between adjacent satellite patterns of bond pads.

In Example 11, the subject matter of Example 9 can optionally include the plurality of separate, substantially identical satellite patterns of bond pads comprises six separate, substantially identical satellite patterns of bond pads that are positioned to form a hexagonal geometric pattern.

In Example 12, the subject matter of Example 9 can optionally include the plurality of separate, substantially identical satellite patterns of bond pads comprises eight separate, substantially identical satellite patterns of bond pads that are positioned to form an octagonal geometric pattern.

In Example 13, the subject matter of any of Examples 8 to 12 can optionally include the substrate includes a plurality of silicon bridges within the substrate wherein each conductive route pattern of the plurality of separate, identical conductive route patterns is formed in a corresponding one of the plurality of silicon bridges.

In Example 14, the subject matter of any of Examples 8 to 12 can optionally include the substrate comprising silicon.

In Example 15, the subject matter of any of Examples 8 to 14 can optionally include the center die being a switch/router.

In Example 16, the subject matter of any of Examples 8 to 15 can optionally include the plurality of substantially identical integrated circuit dice is selected from the group consisting of central processing units, graphics processing units, and field programmed gate arrays.

Example 17 is an electronic system, comprising a board and an integrated circuit package electrically attached to the board, wherein the integrated circuit package comprises an electronic interposer comprising a substrate having a first surface, a central pattern of bond pads on or in the first surface of the substrate, a plurality of separate, substantially identical satellite patterns of bond pads on or in the first surface of the substrate around the central pattern of bond pads, and a plurality of separate, identical conductive route patterns on or in the substrate connecting at least a portion of the bond pads of the central pattern and at least a portion of the bond pads of each satellite patterns of the plurality of separate, substantially identical satellite patterns; a central die electrically attached to the central pattern of bond pads; and a plurality of substantially identical integrated circuit dice, wherein each integrated circuit die of the plurality of substantially identical integrated circuit dice is electrically connected to a corresponding satellite pattern of the plurality of separate, substantially identical satellite pattern.

In Example 18, the subject matter of Example 17 can optionally include the central pattern of bond pads having repeating sets of a specific geometric pattern and wherein the plurality of separate, substantially identical satellite patterns of bond pads are positioned to form the same geometric pattern as the specific geometric pattern of the central pattern of bond pads.

In Example 19, the subject matter of Example 18 can optionally include the plurality of separate, substantially identical satellite patterns of bond pads comprises four separate, substantially identical satellite patterns of bond pads that are positioned orthogonally between adjacent satellite pattern.

In Example 20, the subject matter of Example 18 can optionally include the plurality of separate, substantially identical satellite patterns of bond pads comprises six separate, substantially identical satellite patterns of bond pads that are positioned to form a hexagonal geometric pattern.

In Example 21, the subject matter of Example 18 can optionally include the plurality of separate, substantially identical satellite patterns of bond pads comprises eight separate, substantially identical satellite patterns of bond pads that are positioned to form an octagonal geometric pattern.

In Example 22, the subject matter of any of Examples 17 to 21 can optionally include the substrate includes a plurality of silicon bridges within the substrate wherein each conductive route pattern of the plurality separate, identical conductive route patterns is formed in a corresponding one of the more than four silicon bridges.

In Example 23, the subject matter of any of Examples 17 to 21 can optionally include the substrate comprising silicon.

In Example 24, the subject matter of any of Examples 17 to 23 can optionally include the center die being a switch/router.

In Example 25, the subject matter of any of Examples 17 to 24 can optionally include the plurality of substantially identical integrated circuit dice is selected from the group consisting of central processing units, graphics processing units, and field programmed gate arrays.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electronic interposer, comprising:
a substrate having a first surface;
a central pattern of bond pads on or in the first surface of the substrate, the central pattern of bond pads comprising a first set of bond pads having a first geometric pattern and a separate, second set of bond pads having the first geometric pattern, the first geometric pattern of the second set of bond pads rotated at a first angle with respect to the first geometric pattern of the first set of bond pads;
a plurality of separate, substantially identical satellite patterns of bond pads on or in the first surface of the substrate around the central pattern of bond pads; and
a plurality of separate, substantially identical conductive route patterns on or in the substrate connecting at least a portion of the bond pads of the central pattern and at least a portion of the bond pads of each satellite pattern of the satellite patterns, the conductive route patterns comprising a first route pattern connecting the first set of bond pads to a first of the satellite patterns of bond pads and an identical second route pattern connecting the second set of bond pads to a second of the satellite patterns of bond pads, wherein the second route pattern is rotated at the first angle with respect to the first route pattern.

2. The electronic interposer of claim 1, wherein the second satellite pattern of bond pads is rotated at the first angle with respect to the first satellite pattern of bond pads.

3. The electronic interposer of claim 1, wherein the satellite patterns of bond pads consist of four, six, or eight satellite patterns of bond pads that are positioned orthogonally, in a hexagonal geometric pattern, or in an octagonal geometric pattern, respectively, between adjacent ones of the satellite patterns of bond pads.

4. The electronic interposer of claim 1, wherein the central pattern of bond pads comprises a separate, third set of bond pads having the first geometric pattern, the first geometric pattern of the third set of bond pads rotated at a second angle with respect to the first geometric pattern of the first set of bond pads, wherein the conductive route patterns comprise a third route pattern, identical to the first and second route patterns, connecting the third set of bond pads to a third of the satellite patterns of bond pads, wherein the third route pattern is rotated at the second angle with respect to the first route pattern.

5. The electronic interposer of claim 1, wherein the first geometric pattern is a hexagonal geometric pattern.

6. The electronic interposer of claim 1, wherein the substrate comprises a plurality of silicon bridges within the substrate and wherein each conductive route pattern of the conductive route patterns is in a corresponding one of the silicon bridges.

7. The electronic interposer of claim 1, wherein the substrate comprises silicon.

8. An integrated circuit package, comprising:
an interposer, comprising:
a substrate having a first surface;
a central pattern of bond pads on or in the first surface of the substrate, the central pattern of bond pads comprising a first set of bond pads having a first geometric pattern and a separate, second set of bond pads having the first geometric pattern, the first geometric pattern of the second set of bond pads rotated at a first angle with respect to the first geometric pattern of the first set of bond pads;

a plurality of separate, substantially identical satellite patterns of bond pads on or in the first surface of the substrate around the central pattern of bond pads; and a plurality of separate, identical conductive route patterns on or in the substrate connecting at least a portion of the bond pads of the central pattern and at least a portion of the bond pads of each satellite pattern of the satellite patterns, the conductive route patterns comprising a first route pattern connecting the first set of bond pads to a first of the satellite patterns of bond pads and an identical second route pattern connecting the second set of bond pads to a second of the satellite patterns of bond pads, wherein the second route pattern is rotated at the first angle with respect to the first route pattern;

a central die electrically attached to the central pattern of bond pads; and a plurality of substantially identical integrated circuit dice, wherein each integrated circuit die of the integrated circuit dice is electrically attached to a corresponding satellite pattern of bond pads of the satellite patterns of bond pads.

9. The integrated circuit package of claim 8, wherein the second satellite pattern of bond pads is rotated at the first angle with respect to the first satellite pattern of bond pads, wherein a first of the integrated circuit dice is electrically attached to the first satellite pattern of bond pads and a second of the integrated circuit dice is electrically attached to the second satellite pattern of bond pads, and wherein the second satellite pattern of bond pads is rotated at the first angle with respect to the second satellite pattern of bond pads.

10. The integrated circuit package of claim 8, wherein the satellite patterns of bond pads consist of four, six, or eight satellite patterns of bond pads that are positioned orthogonally, in a hexagonal geometric pattern, or in an octagonal geometric pattern, respectively, between adjacent ones of the satellite patterns of bond pads.

11. The integrated circuit package of claim 8, wherein the central pattern of bond pads comprises a separate, third set of bond pads having the first geometric pattern, the first geometric pattern of the third set of bond pads rotated at a second angle with respect to the first geometric pattern of the first set of bond pads, wherein the conductive route patterns comprise a third route pattern, identical to the first and second route patterns, connecting the third set of bond pads to a third of the satellite patterns of bond pads, wherein the third route pattern is rotated at the second angle with respect to the first route pattern, wherein the integrated circuit dice comprise a third integrated circuit die electrically attached to the third set of bond pads, and wherein he third integrated circuit die is rotated at the second angle with respect to the first integrated circuit die.

12. The integrated circuit package of claim 8, wherein the first geometric pattern is a hexagonal geometric pattern.

13. The integrated circuit package of claim 8, wherein the substrate comprises a plurality of silicon bridges within the substrate and wherein each conductive route pattern of the route patterns is in a corresponding silicon bridge of the plurality of silicon bridges.

14. The integrated circuit package of claim 8, wherein the substrate comprises silicon.

15. The integrated circuit package of claim 8, wherein the center die is a switch/router.

16. The integrated circuit package of claim 8, wherein a type of the integrated circuit dice is selected from the group consisting of central processing units, graphics processing units, and field programmed gate arrays.

17. An electronic system, comprising:
a board; and
an integrated circuit package electrically attached to the board, wherein the integrated circuit package comprises:
an interposer, comprising:
a substrate having a first surface;
a central pattern of bond pads on or in the first surface of the substrate, the central pattern of bond pads comprising a first set of bond pads having a first geometric pattern and a separate, second set of bond pads having the first geometric pattern, the first geometric pattern of the second set of bond pads rotated at a first angle with respect to the first geometric pattern of the first set of bond pads;
a plurality of separate, substantially identical satellite patterns of bond pads on or in the first surface of the substrate around the central pattern of bond pads; and
a plurality of separate, identical conductive route patterns on or in the substrate connecting at least a portion of the bond pads of the central pattern and at least a portion of the bond pads of each satellite pattern of the substantially identical satellite patterns, the conductive route patterns comprising a first route pattern connecting the first set of bond pads to a first of the satellite patterns of bond pads and an identical second route pattern connecting the second set of bond pads to a second of the satellite patterns of bond pads, wherein the second route pattern is rotated at the first angle with respect to the first route pattern;
a central die electrically attached to the central pattern of bond pads; and
a plurality of substantially identical integrated circuit dice, wherein each integrated circuit die of the integrated circuit dice is electrically attached to a corresponding satellite pattern of bond pads of the satellite patterns of bond pads.

18. The electronic system of claim 17, wherein the second satellite pattern of bond pads is rotated at the first angle with respect to the first satellite pattern of bond pads, wherein a first of the integrated circuit dice is electrically attached to the first satellite pattern of bond pads and a second of the integrated circuit dice is electrically attached to the second satellite pattern of bond pads, and wherein the second satellite pattern of bond pads is rotated at the first angle with respect to the second satellite pattern of bond pads.

19. The electronic system of claim 17, wherein the satellite patterns of bond pads consist of four, six, or eight satellite patterns of bond pads that are positioned orthogonally, in a hexagonal geometric pattern, or in an octagonal geometric pattern, respectively, between adjacent ones of the satellite patterns of bond pads.

20. The electronic system of claim 17, wherein the second satellite pattern of bond pads is rotated at the first angle with respect to the first satellite pattern of bond pads, wherein a first of the integrated circuit dice is electrically attached to the first satellite pattern of bond pads and a second of the integrated circuit dice is electrically attached to the second satellite pattern of bond pads, and wherein the second satellite pattern of bond pads is rotated at the first angle with respect to the second satellite pattern of bond pads.

21. The electronic system of claim 17, wherein the first geometric pattern is a hexagonal geometric pattern.

22. The electronic system of claim 17, wherein the substrate comprises a plurality of silicon bridges within the substrate and wherein each conductive route pattern of the route patterns is in a corresponding silicon bridge of the plurality of silicon bridges.

23. The electronic system of claim 17, wherein the substrate comprises silicon.

24. The electronic system of claim 17, wherein the center die is a switch/router.

25. The electronic system of claim 17, wherein a type of the integrated circuit dice is selected from the group consisting of central processing units, graphics processing units, and field programmed gate arrays.

\* \* \* \* \*